US006301183B1

(12) United States Patent
Bondurant et al.

(10) Patent No.: US 6,301,183 B1
(45) Date of Patent: Oct. 9, 2001

(54) ENHANCED BUS TURNAROUND INTEGRATED CIRCUIT DYNAMIC RANDOM ACCESS MEMORY DEVICE

(75) Inventors: David Bondurant; David Fisch, both of Colorado Springs; Bruce Grieshaber, Colorado Spring; Kenneth Mobley; Michael Peters, both of Colorado Springs, all of CO (US)

(73) Assignee: Enhanced Memory Systems, Inc., Colorado Springs, CO (US)

( * ) Notice: Subject to any disclaimer, the term of this patent is extended or adjusted under 35 U.S.C. 154(b) by 0 days.

(21) Appl. No.: 09/626,623

(22) Filed: Jul. 27, 2000

Related U.S. Application Data (63) Continuation of application No. 09/515,007, filed on Feb. 29, 2000, now Pat. No. 6,151,236.

(51) Int. Cl.[7] .................................................... G11C 7/00
(52) U.S. Cl. ............................ 365/222; 365/49; 365/195
(58) Field of Search ............................. 365/222, 49, 195

(56) References Cited

U.S. PATENT DOCUMENTS

| | | | |
|---|---|---|---|
| 5,307,471 | 4/1994 | Ishikawa | 365/49 |
| 5,457,654 | 10/1995 | McLaury | 365/49 |
| 5,537,564 * | 7/1996 | Hazanchuk et al. | 365/222 |
| 5,583,813 | 12/1996 | Dosaka et al. | 365/189.01 |
| 5,636,173 * | 6/1997 | Schaefer | 365/222 |
| 5,715,200 | 2/1998 | Fielder et al. | 365/49 |
| 5,818,777 * | 10/1998 | Seyyedy | 365/222 |
| 5,940,851 | 8/1999 | Leung | 365/222 |
| 5,950,224 * | 9/1999 | Devin | 365/222 |
| 5,983,313 * | 11/1999 | Heisler et al. | 365/189.05 |
| 5,991,851 | 11/1999 | Alwais | 711/106 |
| 5,999,474 | 12/1999 | Leung et al. | 365/222 |
| 5,999,481 * | 12/1999 | Cowles et al. | 365/222 |

OTHER PUBLICATIONS

"ZBT SRAM—Frequently Asked Questions about ZBT SRAMS", Micron Semiconductor Products, Inc., Nampa, ID, Oct. 15, 1999.
EP 01300890.9 Communication dated Jul. 3, 2001, with Partial European Search Report.

* cited by examiner

Primary Examiner—Son T. Dinh
(74) Attorney, Agent, or Firm—William J. Kubida, Esq.; Carol W. Burton, Esq.; Hogan & Hartson, LLP (57) ABSTRACT

An enhanced bus turnaround integrated circuit dynamic random access memory ("DRAM") device of particular utility in providing maximum DRAM performance while concomitantly affording a device with may be readily integrated into systems designed to use zero bus turnaround ("ZBT"), or pipeline burst static random access memory ("SRAM") devices. The enhanced bus turnaround DRAM device of the present invention provides much of the same benefits of a conventional ZBT SRAM device with a similar pin-out, timing and function set while also providing improvements in device density, power consumption and cost approaching that of straight DRAM memory. Through the provision of a "Wait" pin, the enhanced bus turnaround device of the present invention can signal the system memory controller when additional wait states must be added yet still provide virtually identical data access time performance to that of ZBT SRAM for all Read and Write operations with a burst length of four or greater. Use of master/slave and inhibit pins.

11 Claims, 8 Drawing Sheets

FIG. 2

Fig 3A Pipelined Mode

Fig 3B Flow-Through Mode

Fig 3C Refresh Timing

Fig. 4A
Pipeline Mode Timing

ENHANCED BUS TURNAROUND INTEGRATED CIRCUIT DYNAMIC RANDOM ACCESS MEMORY DEVICE

RELATED APPLICATION

The present application is a continuation of U.S. patent application Ser. No. 09/515,007, filed Feb. 29, 2000, entitled ENHANCED BUS TURNAROUND INTEGRATED CIRCUIT DYNAMIC RANDOM ACCESS MEMORY DEVICE now U.S. Pat. No. 6,151,236.

BACKGROUND OF THE INVENTION

The present invention relates, in general, to the field of integrated circuit memory devices. More particularly, the present invention relates to an enhanced bus turnaround (EBT™ is a trademark of Enhanced Memory Systems, Inc., Colorado Springs, Col.) integrated circuit dynamic random access memory ("DRAM") device of particular utility in providing maximum DRAM performance while concomitantly affording a device with may be readily integrated into systems designed to use zero bus turnaround ("ZBT"), or pipeline burst static random access memory ("SRAM") devices.

ZBT is a synchronous SRAM architecture which is optimized for switching and router functions which require frequent and highly randomized Read and Write operations such as those found in typical networking and telecommunications applications. In operation, ZBT SRAM devices serve to eliminate idle clock cycles which might otherwise be encountered in accesses to a data bus which alternate often between Write and Read operations. ZBT SRAM's eliminate dead cycles and provide maximum memory bandwidth utilization. All critical timing parameters for ZBT SRAM devices are referenced to the rising edge of the synchronous clock.

SRAM devices in general, have certain data access time speed advantages when compared to DRAM, with the latter requiring periodic refresh and bit line precharge operations. However, each SRAM memory cell requires four or six transistors per cell, and a DRAM memory cell can be constructed utilizing only a single transistor and associated capacitor (i.e. 1T/1C). Consequently, a typical SRAM device consumes on the order of four times more die area and two times the power of a corresponding DRAM. Ultimately, a SRAM of the same density of a DRAM will cost five to ten times more. Thus, there is a significant cost premium associated with the better SRAM performance.

SUMMARY OF THE INVENTION

The present invention advantageously provides an enhanced bus turnaround DRAM device which provides much of the same benefits of a conventional ZBT SRAM device with a similar pin-out, timing and function set while also providing improvements in device density, power consumption and cost. Through the provision of a "Wait" pin, the enhanced bus turnaround device of the present invention can signal the system memory controller when additional wait states must be added. Yet, it still provides virtually identical data access time performance to that of ZBT SRAM for all Read and Write operations with a burst length of four times or greater.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A PREFERRED EMBODIMENT

Figure 1:
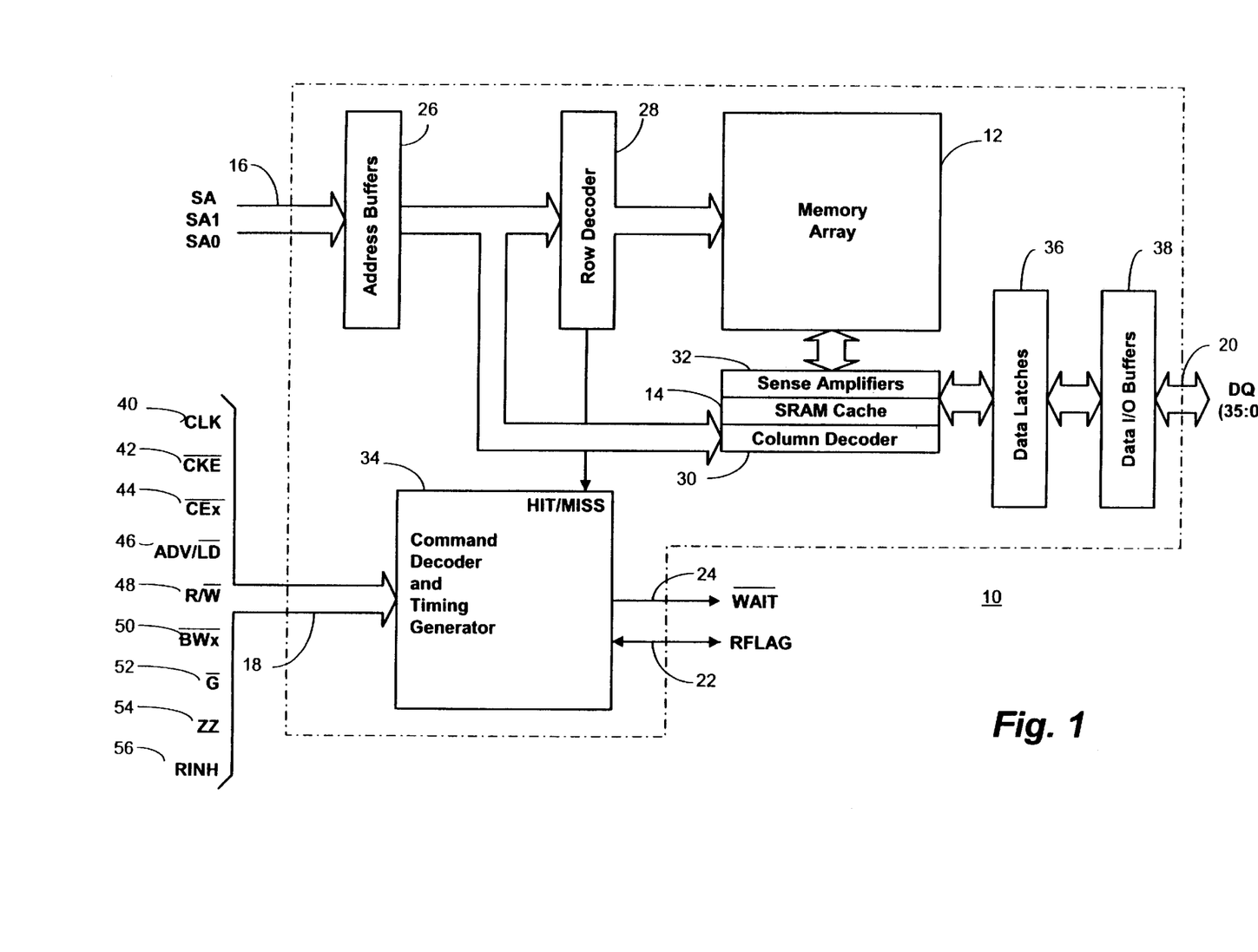
FIG. 1 is a simplified functional block diagram of an enhanced bus turnaround integrated circuit memory device in accordance with the present invention.

With reference now to FIG. 1, a simplified functional block diagram of an enhanced bus turnaround integrated circuit memory device 10 in accordance with the present invention is shown. The memory device 10 comprises, in pertinent part, a DRAM memory array 12 which may comprise one or more banks of dynamic random access memory. A row cache 14, which in a preferred embodiment comprises SRAM memory, is associated with each bank of the memory array 12 and can be shared between blocks or direct mapped to each block.

A synchronous address bus 16 comprising input signals SA0, SA1 and SA for example, and a number of control inputs to a control bus 18 are applied to the memory device 10. Data read from, and written to, the memory device 10 is furnished on bidirectional DQ bus (data bus) 20 which, in the particular embodiment illustrated, comprises 36 separate lines (35:0).

The address bus 16 is supplied to a number of address buffers 26 and then to separate row and column decoders 28, 30 for accessing specific locations within the memory array 12 and cache 14 as will be more fully described hereinafter. A series of sense amplifiers 32 are associated with the memory array 12 and interposed between the cache 14 and memory array 12. Data read from, and to be written to, the memory array 12 is stored in a number of bidirectional data latches 36 and data input/output ("I/O") buffers 38. In the preferred embodiment, the addresses for the rows and columns are provided at the same time, but they could also be multiplexed with the row address provided prior to the column address.

As also illustrated, the memory device 10 also includes a command decoder and timing generator block 34 which is coupled to the control bus 18 as well as a Hit/Miss signal from the row decoder 28. Inputs to the block 34 include a synchronous clock signal ("CLK") 40, an active low clock enable signal ("CKE") 42, an active low chip enable signal ("CEx") 44, an address advance/active low load signal ("ADV/LD") 46, a read/active low write signal ("R/W") 48, an active low byte write enable signal ("BWx") 50, an active low output enable signal ("G") 52, a "snooze" enable signal ("ZZ") 54 and a refresh inhibit signal ("RINH") 56, all as will be more fully described hereinafter. The memory device 10 may, in an alternative embodiment, include a flow through ("FT", FIG. 2) input signal as well as additional supply voltage input pins (not shown) including VDD, VSS, VDDQ and VSSQ. The command decoder and timing generator block 34 provides an active low wait output signal ("WAIT") 24 as well as a bidirectional refresh flag signal ("RFLAG") 22, the function of which will be more fully described hereinafter.

The memory device 10 architecture is based on Enhanced Memory Systems, Inc. proprietary technology which couples fast DRAM arrays 12 with SRAM caches 14 to improve memory latency. The memory device 10 may, in a representative embodiment, be internally organized with a memory array 12 having four DRAM banks and a 4.5 Kb row cache 14 per bank.

The same advantages can be achieved with higher and lower density implementations. While the memory device 10 provides essentially ZBT SRAM-like performance for most random access burst cycles, occasionally it requires more time to respond to the initial data word in a burst. For this reason, a WAIT signal 24 pin is added to the standard ZBT SRAM interface to allow an associated memory device 10 controller to account for the difference in servicing initial accesses. The memory device 10 is, in a preferred embodiment, a synchronous device, with the rising edge of the clock signal determining all input and output actions, with the exception of the output enable G signal 52 and sleep ZZ signal 54 inputs, which are asynchronous. All inputs must be setup and held to the rising edge of the input clock. Each memory access begins with the ADV/LD signal 46 pin low and a valid address (a VMA signal) or portion thereof. The memory device 10 determines whether the address matches any of the currently cached address, and if it is, the memory device 10 delivers Read data out, or is able to accept Write data in, without the addition of any wait states. If the new address or portion thereof is not in cache, the memory device cannot service the Read or Write cycle at ZBT SRAM speeds and a wait state or two must be added. The associated memory controller must monitor the memory device 10 WAIT signal 24 pin for these cases. It should be noted that support of both memory device 10 and ZBT SRAM types in a given design is relatively simple and straightforward with only minimal changes to the controller design being required, such as the addition of a single wire to the interface.

Figure 2:
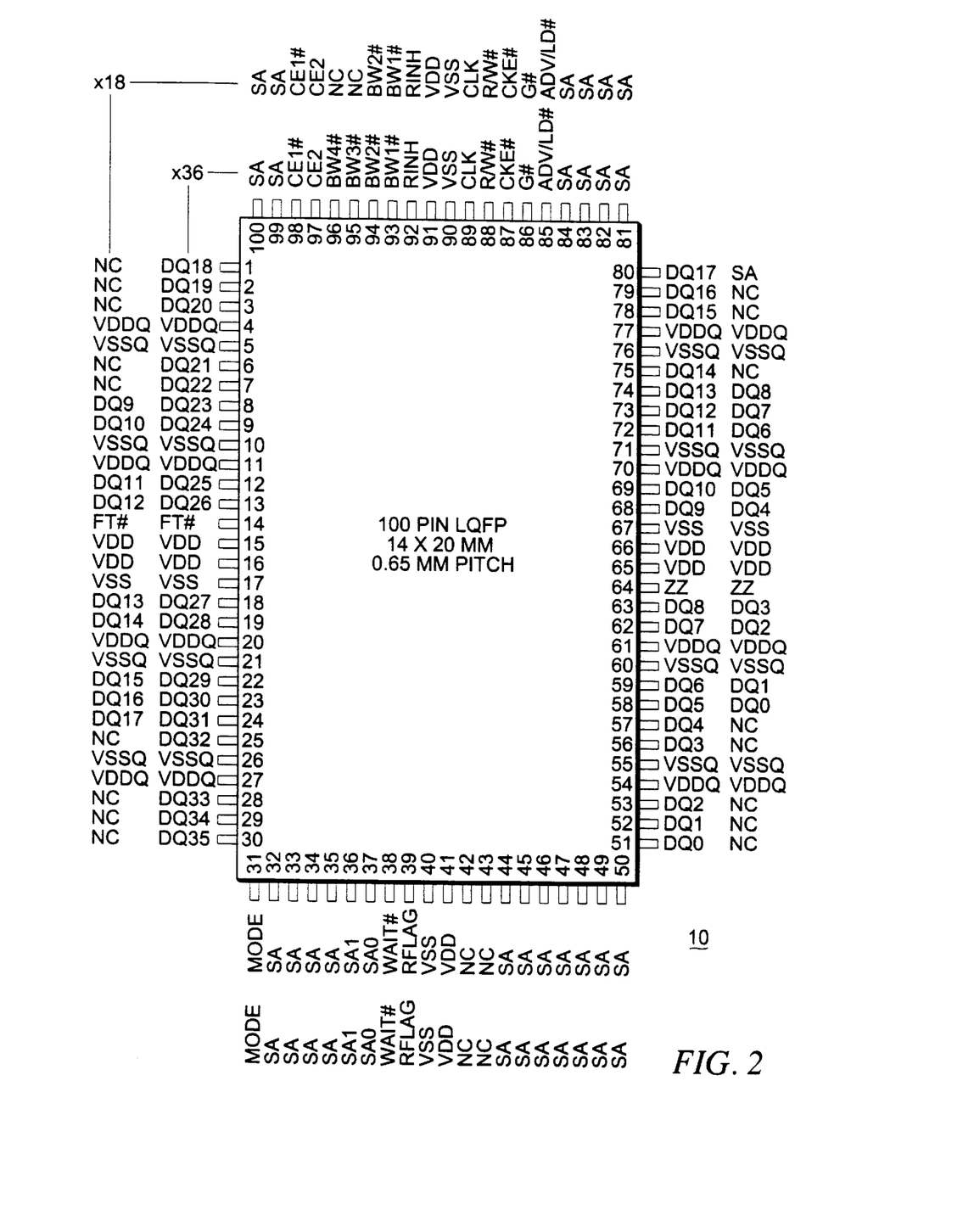
FIG. 2 illustrates representative pin-outs for various embodiments of a memory device in accordance with the present invention in 512K×36 and 1M×18 configurations.

With reference additionally now to FIG. 2, representative pin-outs for various embodiments of a memory device 10 in accordance with the present invention in 512K×36 and 1M×18 configurations are illustrated and described in more detail in the following Table 1:

TABLE 1

| Symbol | Type | Function |
| --- | --- | --- |
| CLK | Input | CLOCK: This signal registers the address,data,chip enables,byte write enables and burst control inputs on its rising edge.All synchronous inputs must meet setup and hold times around the rising edge of clock. |
| CKE# | Input | CLOCK ENABLE: CKE#is active low and activates the internal clock. When CKE#is high,the device ignores the clock input (CLK) and stalls any pending cycles.CKE#always has a latency of zero independent of the FT#pin setting. |
| CE1# | Input | CHIP ENABLE: This active low input is used to enable the device and is sampled only when a new external address is loaded (ADV/LD#low). |
| CE2 | Input | CHIP ENABLE: This active high input is used to enable the device and is sampled only when a new external address is loaded (ADV/LD#low). |
| SA0, SA1,SA | Input | SYNCHRONOUS ADDRESS: These inputs are registered and must meet the setup and hold times on the rising edge of CLK when ADV/LD#is low.A0 and A1 are the two least significant bits of the address field and set the internal burst counter for burst cycles. |
| ADV/LD# | Input | ADDRESS ADVANCE/LOAD: When high,this pin is used to advance the internal burst counter and both R/W#and the external address are ignored. When it is low,a new address is loaded on the rising edge of clock (CLK). |
| R/W# | Input | Read/Write: When ADV/LD#is low,this pin determines whether the new cycle is a Read or Write cycle.To transition from a read to a write or from a write to a read,a new address must be loaded. When both R/W#and ADV/LD#are low,a Write cycle starts.Byte Write operation is controlled by the BWx#pins.When R/W#is high and ADV/LD#is low,a Read cycle starts and the BWx#pins are ignored. |

TABLE 1-continued

| Symbol | Type | Function |
|---|---|---|
| BW1#, BW2#, BW3#, BW4# | Input | BYTE Write ENABLE: These active low inputs allow individual bytes to be written when a Write cycle is active and must meet setup and hold times around the rising edge of clock.Byte Write Enabies must be valid on the same cycle as the address load and subsequent cycles for burst writes.BWx#has a latency of one cycle when FT#is low,and a latency of two when FT#is high.BW1#controls DQO-8 pins,BW2#controls DQ9-17 pins,BW3#controls DQ1 8-26 pins, BW4#controls DQ27-35 pins. |
| DQ0–DQ35 | Input/ Output | DATA I/O: Data bus inputs and outputs.For Write cycles,input data is applied to these pins and must be set-up and held relative to the rising edge of clock. For read cycles,the device drives output data on these pins after the CAS latency is satisfied. |
| G# | Input | OUTPUT ENABLE: This active low asynchronous input enables the I/O output drivers. |
| WAIT# | Output | WAIT: The WAIT#pin adds wait states to the memory controller to synchronize the EBT RAM timing. |
| RINH | Input | REFRESH INHIBIT: This active high input inhibits internai refresh cycles for short time periods.This feature allows criticai read/write cycles to complete without interruption by refresh. |
| RFLAG | Input Output | REFRESH FLAG: When MODE is low,this pin is an output and is used to signai another device when to refresh. |
| MODE | Input | MODE: Determines the internal refresh mode of operation.When MODE is low,the device operates in Auto refresh mode in which internal refresh cycles automatically occur.When MODE is high,the device operates in Manual refresh mode in which internal refresh cycles must be initiated by an external controller. |
| FT# | Input | FLOW THROUGH: When FT#is high,the device operates in the Pipelined Mode.Read and write data latency is two cycles in Pipelined Mode unless WAIT#is applied.When FT#is low,the device operates in Flow-Through Mode. Read and write data latency is one cycle in Flow-Through Mode unless WAIT#is applied. |
| ZZ | Input | SNOOZE ENABLE: Active high input that causes device to enter low-power sleep mode. |
| $V_{DD}, V_{SS}$ | Supply | Power(+3.3 V)and ground for the input buffers and core logic. |
| $V_{DDQ}, V_{SSQ}$ | Supply | Isolated power supply and ground for output buffers.VDDQ may be connected to either 3.3V or 2.5 V power. |

The memory device 10 is fundamentally, a DRAM-based memory device which can provide DRAM cost and power advantages, while allowing easy integration into a system designed to use conventional ZBT SRAM devices. The memory device 10 may be provided in a number of different memory configurations including, for example, IM×I8, 512K×36 and may be packaged in a 100 Pin QFP quad flat package, ZBT configuration "superset" pinouts, or embedded configurations. In the particular embodiment disclosed, the memory device 10 can provide a 66 MHz Flow-Through and 133 MHz Pipelined Modes of operation and a Low Power Sleep Mode with guaranteed data retention. It can provide user selectable Automatic/Manual Refresh Modes allowing for Master/Slave Refresh with synchronization of multiple devices and critical period Refresh Inhibit Function. An internally generated WAIT signal 24 output flag allows for simple memory control.

In the particular embodiment disclosed herein, the memory device 10 may comprise a memory array 12 including four DRAM banks, each with an associated 4.5 Kb SRAM cache 14, to allow early precharge of Read "Miss" cycles, immediate access on Read "Hit" cycles, hidden refresh of the DRAM memory array 12, and to hide read or write miss access latency behind current bursts. Both the Synchronous Row Address Strobe-to Column Address Strobe ("RAS-to-CAS") and Synchronous Precharge Delays would be periods of 2 clocks in Pipelined Mode and 1 clock delay time in Flow-Through Mode. A Synchronous Automatic Refresh Cycle of 6 clocks delay time in Pipelined Mode and 4 clocks delay time in Flow-Through Mode, and a Synchronous Manual Refresh Cycle of 5 clocks delay time in Pipelined Mode and 3 clocks delay time in Flow-Through Mode are achieved. A fast internal tag comparison allows for "No Wait" (or zero bus turn "ZBT") access on Read "Hit" cycles. In this embodiment a "Write Transfer Mode" of operation cache load strategy may be issued and there is an automatic precharge on all DRAM cycles. The memory device 10 may also include multiple burst sequences selectable by, for example, a fuse option as well as an "Always Miss" option to allow for a simple, low-performance controller solution.

The WAIT signal 24 pin is used to signal any access delay caused by either RAS-to-CAS delay requirements, Access Collision constraints, or Refresh Collision constraints. Any Hit/Miss or Collision determination will be made, and the WAIT signal 24 pin will be asserted, within a time period $Tac^{wait}$ following a Read or Write Cycle request. The wait signal is generated by the chip as needed and is an output state which the controller must strike. On all Read "Miss" or Write "Miss" Cycles, a fixed Trcd delay of 2 cycles for Pipelined Mode, or 1 cycle for Flow-Through Mode will be enforced by the assertion of a wait signal. Further delays may be required to allow the completion of an ongoing cycle or the precharge of an open DRAM row when collisions occur. In such cases, the WAIT signal 24 must be asserted for the necessary delay to allow the completion of the current cycle in addition to the Trcd delay required by the access request.

A MODE signal pin (FIG. 2) may also be used to select either Automatic (Master) or Manual (Slave) Refresh Modes of operation. The RINH signal 56 pin can be used to inhibit refresh cycles in the Automatic Refresh Mode, or to initiate refresh cycles in the Manual Refresh Mode. The RINH signal 56 is synchronized to the clock high transition. During Refresh Inhibit periods, inhibited refresh cycles may, for example, increment a Refresh Pending Counter, which could then be used to initiate an appropriate sequence of back-to-back refresh cycles once the inhibit period is over. The RFLAG signal 22 output pin will generally be asserted, only by devices which are in Automatic Refresh Mode, such that a device in Manual Refresh Mode, with its RINH signal 56 pin connected to the RFLAG signal 22 pin of the "Master" (Automatic Mode) device, will initiate refresh cycles which are synchronized with the Master device. In order to achieve this synchronization, refresh cycles can be fixed at 6 clocks (or 4 clocks in Flow-Through Mode) for Automatic Refresh Mode, and 5 clocks (or 3 clocks in Flow-Through Mode) for Manual Refresh Mode Devices. Coupled with an initial Power-On Reset of the Refresh Address Register and Refresh Pending Counter, this will allow the RFLAG signal 22 to synchronize refresh across a group of devices.

The synchronization of refresh cycles is not a necessary part of the embodiment but it provides a significant advantage in embodiments using more than one EBT part by minimizing the time the wait pin must be asserted to support internal refresh. If the refresh operations are not synchronized, each chip could potentially need a wait time at a different time. Thus, a system with 16 chips could have system wait times up to 16 times higher than achieved with this solution. A Power-On Reset may be included to reset the Refresh Address Register and Refresh Pending Counter upon power up and, ideally, the same Reset could poll all fuses and ensure that the outputs are initially Hi-Z (i.e., high impedance).

As utilized herein, the following definitions pertain:

Access Collision: Any cycle requiring DRAM memory array 12 access to a different row within a bank which is currently open. In the event of an access collision, the WAIT signal 24 will be asserted for the necessary period to ensure that the time periods Trp, Trc, and Trcd are satisfied. Access to alternate banks of the memory array 12 does not result in a collision, and hence can proceed without WAIT signal 24 assertion.

Automatic Refresh Mode: A mode which selects a refresh methodology wherein the DRAM memory array 12 refresh cycles will be initiated by the memory device 10 as needed and command execution will be stalled as necessary by the inclusion of additional command latency in order to accommodate the refresh cycles. When the memory device 10 is operated in this mode, (which may be selected by the state of a MODE pin) refreshes can be prevented during critical timing periods by the use of the RINH signal 56 pin, which will inhibit the execution of refreshes when it is asserted high. The memory array 12 will then execute the necessary number of refreshes, once the inhibit has cleared, to ensure data integrity. The RFLAG signal 22 pin will become an output which is driven such that Manual Mode devices, with their RINH pin 56 driven by the master's RFLAG signal 22 output, will be synchronized to the Automatic Mode device. On power-up, the initial refresh address will be set on all memory devices 10 in order that this master/slave method can be used to ensure synchronous operation of all memory devices 10 which are accessed in parallel.

Burst Sequence: A predetermined sequence of column addresses to be used in Read or Write cycles as will be more fully described hereinafter. For the memory device 10, burst sequences may be selected, for example by a fuse option, to include any of the following: 4 cycle sequential burst, 4 cycle interleaved burst (Intel® sequence), 8 cycle sequential burst, 8 cycle interleaved burst, 128 cycle sequential burst or 128 cycle interleaved burst.

Cache or Row Cache: A readable SRAM cache 14, or register, that can be loaded from the DRAM memory array 12 bit lines to allow DRAM data to be made available to the outputs in standard fashion while the DRAM memory array 12 is being precharged or refreshed.

Deselect or Stop Command: A synchronous command, initiated when a particular memory device 10 is deselected by one or more of the chip enable ("CE") signal 44 pins and ADV/LD signal 46 is low on the rising edge of the clock. A deselect command will stop any ongoing burst cycles and precharge any open DRAM pages, after which the memory device 10 will remain in a deselected (standby) state until a read or write command is given, or a refresh is initiated.

Flow-Through Mode: The memory device 10 mode of operation wherein command and data is accessed with a nominal one-clock latency, as opposed to Pipelined Mode wherein commands are executed with a nominal two-clock latency. In a particular embodiment of the memory device 10, this mode selection may be controlled by a flow through ("FT") input pin.

Live Clock Edge: Any rising edge of the clock upon which a command, address, or data input can be accepted. Live clocks are flagged by the WAIT output signal 24 pin with a latency of one clock in Pipelined Mode and a latency of zero in the Flow-Through Mode.

Load: The SRAM cache 14 is loaded on any "Miss" (Read "Miss", Write "Miss") cycle. If provided on-chip, the tag register and the SRAM cache 14 can both be loaded with appropriate information on any load cycle.

Manual Refresh Mode: A mode which selects a refresh methodology wherein all memory array 12 refreshes can be requested explicitly by assertion of the RINH signal 56 on a rising clock edge. When the memory device 10 is in this mode, (which may be selected by the state of the MODE pin), refreshes will be executed only when specifically requested through the assertion of the RINH input signal 56 on the rising edge of the clock. This allows refreshes to be controlled by a "master" chip or by the controller.

Pipelined Mode: The memory device 10 mode wherein command and data is accessed with a nominal two-clock latency, as opposed to Flow-Through Mode wherein commands are executed with a nominal one-clock latency. In a particular embodiment of the memory device 10, this mode selection may be indicated by the state of an FT input pin as mentioned previously.

Precharge: The process of closing the memory array 12 DRAM row and preparing the DRAM bank for a new cycle. Once the precharge has begun, it cannot be aborted and must be completed before a new cycle can be initiated to the same bank. Generally, Precharge should be initiated on the first clock cycle following the last data-in on a write cycle and on the first clock following the WAIT signal 24 termination on a read cycle, unless the precharge is delayed by another intervening cycle.

Read/Write Latency (Trcd): The additional delay necessary from the initiation of a memory array 12 DRAM cycle. For instance, this causes the increased latency for a Read "Miss" vs. a Read "Hit" cycle. This required delay may be signaled by the assertion of the WAIT signal 24 output pin as needed.

Read Cycle: A synchronous cycle, initiated when the particular memory device 10 is selected, ADV/LD signal 46 is low, and the read/write ("R/W") signal 48 is high on the rising edge of the clock during which data is to be read from the memory device 10 and provided to the output pins of the output bus 20. Once a Read cycle has been initiated, and the appropriate latency has been met, new data will continue to be retrieved and driven to the outputs on each subsequent rising clock edge until the Read cycle is terminated by a Deselect command or interrupted by an intervening Read or Write command. The initial address is provided to the memory device 10 when the Read cycle is initiated and subsequent Read addresses will be generated internally by the memory device 10 according to a pre-determined sequence which may be set by the state of fuse options. Address sequences in the preferred embodiment may be any of the following: 4 cycle sequential burst (A2 never toggles, loops after four cycles), 4 cycle interleaved burst (Intel® sequence), 8 cycle sequential burst, 8 cycle interleaved burst, 128 cycle sequential burst or 128 cycle interleaved burst. Read "Hit" cycles will retrieve the data directly from the SRAM cache 14 without accessing the DRAM memory array 12. Read "Miss" cycles will access the DRAM memory array 12, load the SRAM cache 14 and then precharge the DRAM memory array 12 while retrieving the data from the SRAM cache 14.

Read Hit: A Read cycle executed to an address that has already been loaded into SRAM cache 14. Each bank has its own cache 14, and hence, its own "Hit" address. An on-chip tag register (not shown, one for each bank) is loaded with the row address anytime that the cache 14 is loaded as previously described. An address comparison is then executed on each Read cycle to determine whether the appropriate portion of the address field matches that stored in the tag register. If a match is detected, then the requested data is known to be already loaded into the cache 14 and the Read cycle is executed directly from the cache 14 without activating the DRAM memory array 12. This allows a faster Read access and avoids the execution of an unnecessary DRAM cycle.

Read Miss: Any read cycle that is not a "Hit" as defined above.

Refresh: An internally self-timed DRAM memory array 12 cycle to restore the strength of the stored data. In a particular embodiment of the present invention, at least 4K refresh cycles must be run within any 64 ms period. Fuse, or other selectable options may be provided to allow for faster or slower refresh rates in the Automatic Refresh mode. Refresh cycles can be initiated manually or automatically according to the mode in which the memory device 10 is operated. During normal operation, most refresh cycles will have minimal impact on memory device 10 operation since refreshes can be automatically hidden behind cache 14 read access or alternate bank access to the memory array 12. During critical periods, timing may be guaranteed through the use of the RINH signal 56 refresh inhibit pin. Multiple memory devices 10 can be synchronized through the use of a master/slave approach as previously described with respect to the Automatic Refresh and Manual Refresh Modes of operation.

Refresh Address Register: A register which may be provided containing the address of the next row to be refreshed. This register may be initialized upon Power-Up and incremented each time a refresh is run.

Refresh Pending Counter: A counter which may be used to count the number of pending refresh cycles during a refresh inhibit period. This counter may also be initialized upon Power-Up, incremented each time a refresh is requested but inhibited and decremented (unless zero) each time a refresh operation is run. The value is of particular use by memory devices 10 which are operating in Automatic Refresh Mode to initiate an appropriate "flurry" refresh following a relatively long refresh inhibit period.

Refresh Collision: Any cycle requiring DRAM memory array 12 access to a bank which is currently in the process of being refreshed. The WAIT signal 24 pin can be asserted during refresh operations 12 in the event of a Collision. Access to alternate banks can occur during a refresh cycle without WAIT signal 24 assertion.

Rising Edge of the Clock: Any rising edge of the clock ("CLK") signal 40 pin when the clock enable ("CKE") signal 42 pin is low. A rising clock edge which is masked by a CKE high signal 42 will be ignored by the memory device 10 and the behavior of the device can be expected to be consistent with that which would be expected if the external clock CLK signal 40 had stayed low for the entire external clock cycle.

Sleep Mode: A mode in which all device inputs are power-gated (except ZZ signal 54) all DRAM banks in the memory array 12 are precharged and self refreshed, all bursts are terminated and all power generation circuitry is placed in a Standby Mode such that power dissipation is minimized. Entry into, and exit from, the sleep mode should occur in a controlled fashion to insure data integrity and proper memory device 10 operation.

Tag Register: A set of address registers (not shown, for example, one register for each bank of the memory array 12) which store the tag address of the most recently loaded cached DRAM data. These stored addresses, or Tags, are compared to current addresses to determine Hit/Miss status on Read or Write cycles.

Write Cycle: A synchronous cycle, initiated when the memory device 10 is selected, the ADVILD signal 46 is low, and the R/W signal 48 is low on the rising edge of the clock, during which data is to be written to the memory device 10 and provided from the input pins on the DQ bus 20. Once a write cycle has been initiated, and the appropriate latency has been met, new data will continue to be retrieved and driven to the memory array 12 on each subsequent rising clock edge until the Write cycle is terminated by a Deselect command or interrupted by an intervening Read or Write command. The initial address is provided to the memory device 10 when the Write cycle is initiated and subsequent Write addresses will be generated internally by the memory device 10 according to a pre-determined sequence which is set by the state of any available options. In a representative embodiment, address sequences may be any of the following: 4 cycle sequential burst (A2 never toggles, loops after four cycles), 4 cycle interleaved burst (Intel® sequence), 8 cycle sequential burst, 8 cycle interleaved burst, 128 cycle sequential burst or 128 cycle interleaved burst. Whenever possible, Write "Hit" cycles will write the data directly to an already open DRAM page without suffering the access delay associated with closing and reopening the DRAM memory array 12. Write "Miss" cycles will access the DRAM memory array 12, load the cache 14, write the appropriate data to the memory array 12 and then precharge the DRAM memory array 12 unless the precharge is delayed by an intervening Write "Hit" cycle.

Write Hit: A Write cycle executed to a DRAM row that is still open from a previous Write cycle. Write "Hit" cycles will generally occur only when a Write cycle is interrupted by another Write request. A Write "Hit" occurs when a Write is requested, prior to the precharge of the previous write cycle (as described previously with respect to Precharge), and a "Hit" Comparator (not shown) detects that this is a tag "Hit" address (as described with respect to Read "Hit") and is, therefore, to the currently opened Write row. When this occurs, the precharge of the open row is delayed, and the Write "Hit" cycle is executed prior to the row precharge. It should be noted that Writes cannot be "Hits" once the row has been closed (or once the precharge cycle has begun) even though the address comparison may result in a tag "Hit".

Write Miss: Any Write cycle that is not a "Hit" as defined above.

Write Transfer Mode: A possible memory device 10 mode of operation wherein the cache 14 and tag may be overwritten on write cycles. In the embodiment disclosed herein, the memory device 10 operates in a Write Transfer Mode.

Figure 3A:
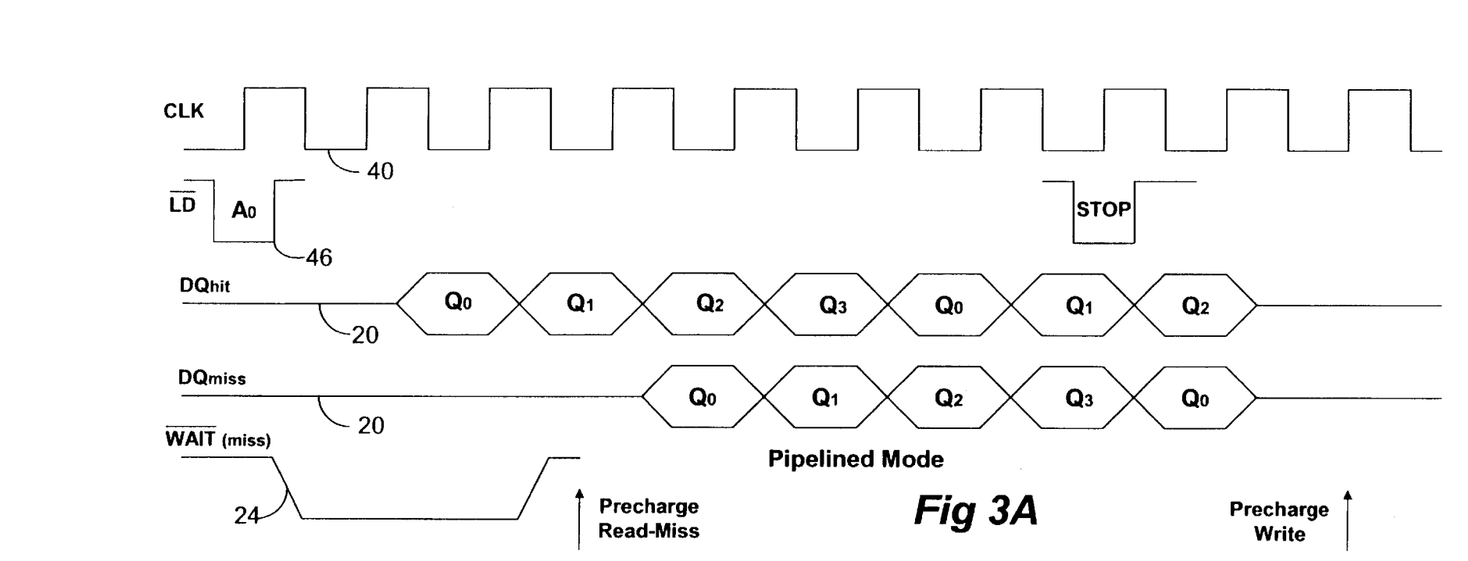
FIG. 3A is a representative timing diagram for a memory device in accordance with the present invention operating in a Pipelined Mode of operation.
Figure 3B:
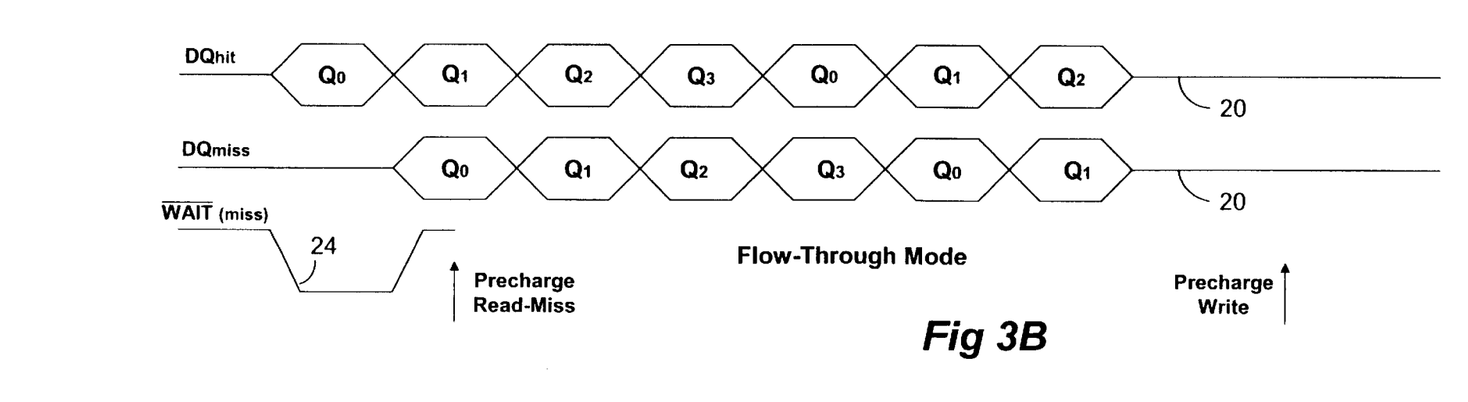
FIG. 3B is a corresponding representative timing diagram for a memory device in accordance with the present invention operating in a Flow-Through Mode of operation.

With reference additionally now to FIGS. 3A and 3B, representative timing diagrams for a memory device 10 in accordance with the present invention operating in a pipelined and Flow-Through Modes of operation are shown. In these figures, the relative timing and activity for the active low "Load" input signal 46 ("LD"), DQ bus 20 and active low "Wait" output signal 24 are shown with respect to the input synchronous clock signal 40.

Figure 3C:
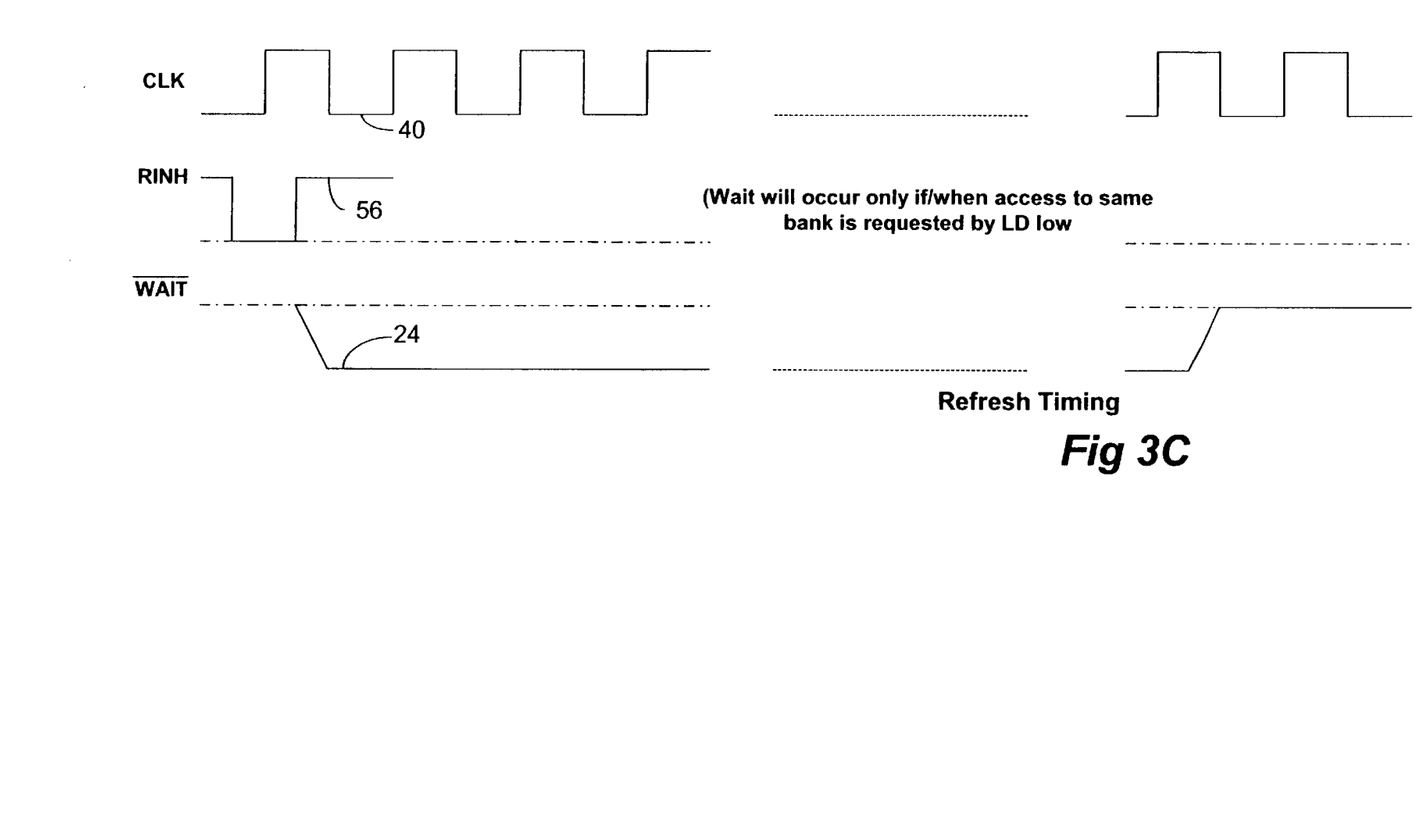
FIG. 3C is a representative timing diagram for a memory device in accordance with the present invention illustrating the device refresh timing.

With reference additionally now to FIG. 3C, a representative timing diagram for a memory device 10 in accordance with the present invention is shown illustrating the device refresh timing and with respect to the foregoing timing diagrams, it should be noted that commands can be asserted on any "live" clock, however they should be throttled by the associated controller to comply with the Taad specification in the following Table 2. "Live" clocks are defined by the Wait output signal 24. For the Pipelined Mode of operation, the Wait signal 24 latency is one clock. For the Flow-Through Mode, the Wait signal 24 latency is zero. The memory device 10 operates in the "Write Transfer Mode", that is, the cache 14 is loaded on a Write "Hit". Reads are precharged on the first rising clock edge following the assertion of read initiated Wait signal 24 and Writes are precharged on the first rising clock edge following the last data in. For Manual Mode, refreshes occur only when specifically requested by RINH signal 56 low on the rising edge of CLK signal 40. For Automatic Mode, refreshes are self generated but can be inhibited by the synchronous RINH signal 56. "Auto/Manual" refresh mode is determined by the state of the Mode pin. In Automatic mode, the RFLAG output signal 22 pin will be driven such that it can be fed into the RINH signal 56 pin of other memory devices 10 that are in Manual mode. This allows all refresh operations in multiple chip applications to occur concurrently.

TABLE 2

| Specification | Pipelined Mode | Flow-Through Mode | Units |
| --- | --- | --- | --- |
| Taad | 2 | 1 | Live Clocks |
| Trcd | 2 | 1 | Clocks |
| Trp | 2 | 1 | Clocks |
| Tck | min 7.5 | min 15 | nsec |
| Tac$^{data}$ | max 4.5 | max 11 | nsec |
| Tac$^{wait}$ | max 4.5 | max 11 | nsec |
| Tc5/a5/d5 | min 2 | min 2 | nsec |
| Tah/ch/dh | min 0.5 | min 0.5 | nsec |
| Trc$^{refresh}$ | 6/5# | 4/3# | Clocks |
| Hit Latency | 2 | 1 | Clocks |
| Miss Latency | 4* | 2* | Clocks |
| Izz | 2 | 2 | mA |
| Imax | 250 | 250 | mA |

Master Mode/Slave Mode
*From Precharged Idle

Figures 4A, 4B:
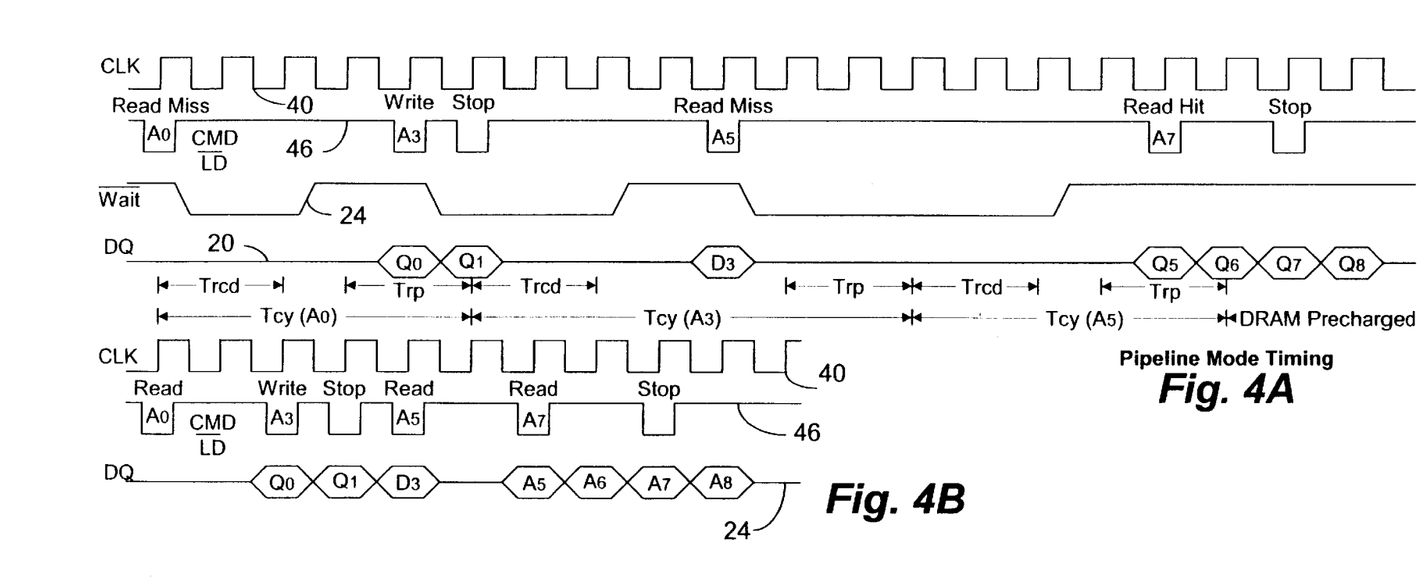
FIG. 4A is a representative timing diagram for a memory device in accordance with the present invention operating in a Pipelined Mode of operation with no refresh interrupts and all cycles executing in the same DRAM memory bank.
FIG. 4B is a corresponding representative timing diagram for a conventional ZBT SRAM device operating in an analogous manner to that illustrated in FIG. 4A.

With reference additionally now to FIGS. 4A and 4B, a representative timing diagram for a memory device 10 in accordance with the present invention operating in a Pipelined Mode of operation with no refresh interrupts and all cycles executing in the same DRAM memory is shown in comparison with a conventional ZBT SRAM device operating in an analogous manner respectively. This is a worse case scenario requiring page closure and new cache loads on each read or write command. Furthermore, this illustrates the wait pin function. With respect to these figures, like signals to that previously described with respect to preceding figures are like numbered and a 133 MHz operating frequency is assumed in Pipelined Mode with no interrupts and all cycles executed to the same bank of the memory array 12 to illustrate worst case timings.

Figures 5A, 5B:
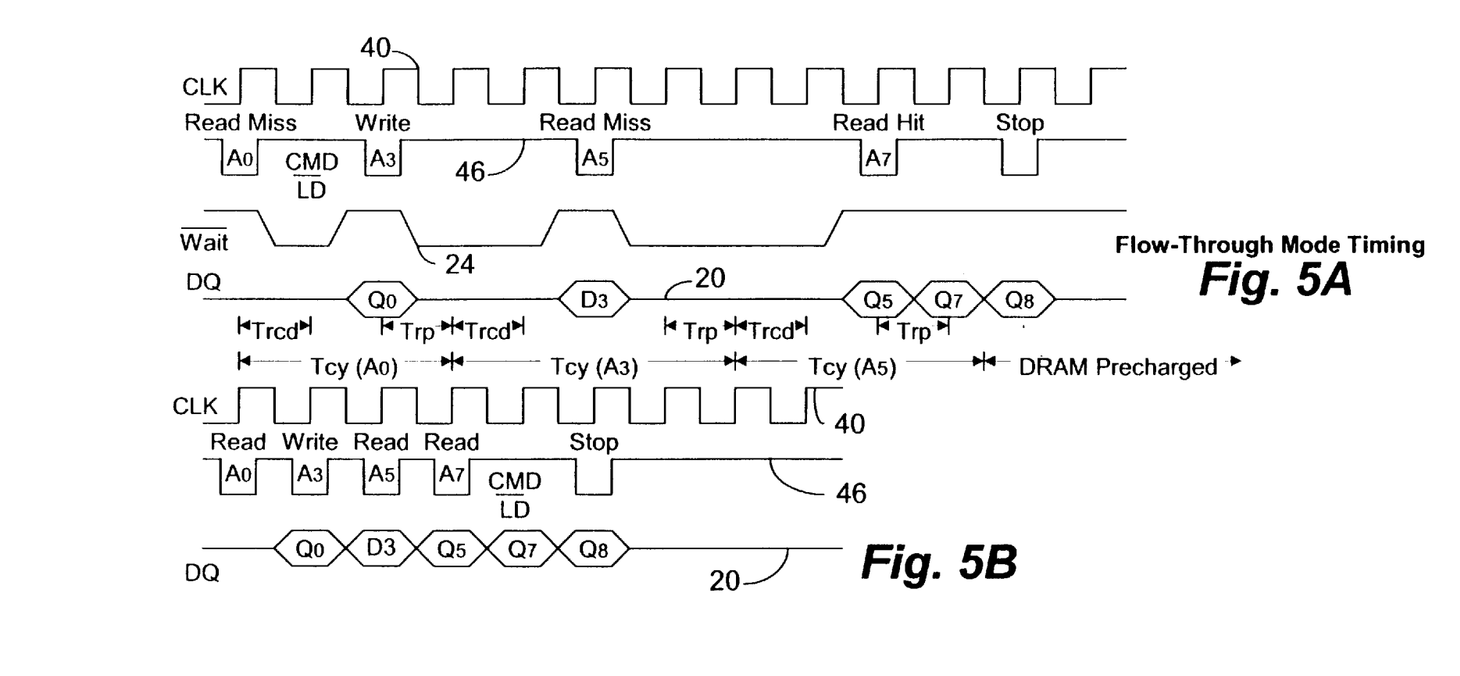
FIG. 5A is a representative timing diagram for a memory device in accordance with the present invention operating in a Flow-Through Mode of operation with no refresh interrupts and all cycles executing in the same DRAM memory bank.
FIG. 5B is a corresponding representative timing diagram for a conventional ZBT SRAM device operating in an analogous manner to that illustrated in FIG. 5A.

With reference additionally now to FIGS. 5A and 5B, a representative timing diagram for a memory device 10 in accordance with the present invention operating in a Flow-Through Mode of operation with no refresh interrupts and all cycles executing in the same DRAM memory bank is shown in comparison with a conventional ZBT SRAM device operating in an analogous manner respectively. With respect to these figures, like signals to that previously described with respect to preceding figures are like numbered and a 66 MHz operating frequency is assumed in Flow-Through Mode with no refresh interrupts and all cycles again executed to the same bank of the memory array 12 for worst case timings. This again illustrates a worst case operation of this embodiment, this time in Flow-Through Mode.

Figure 6A:
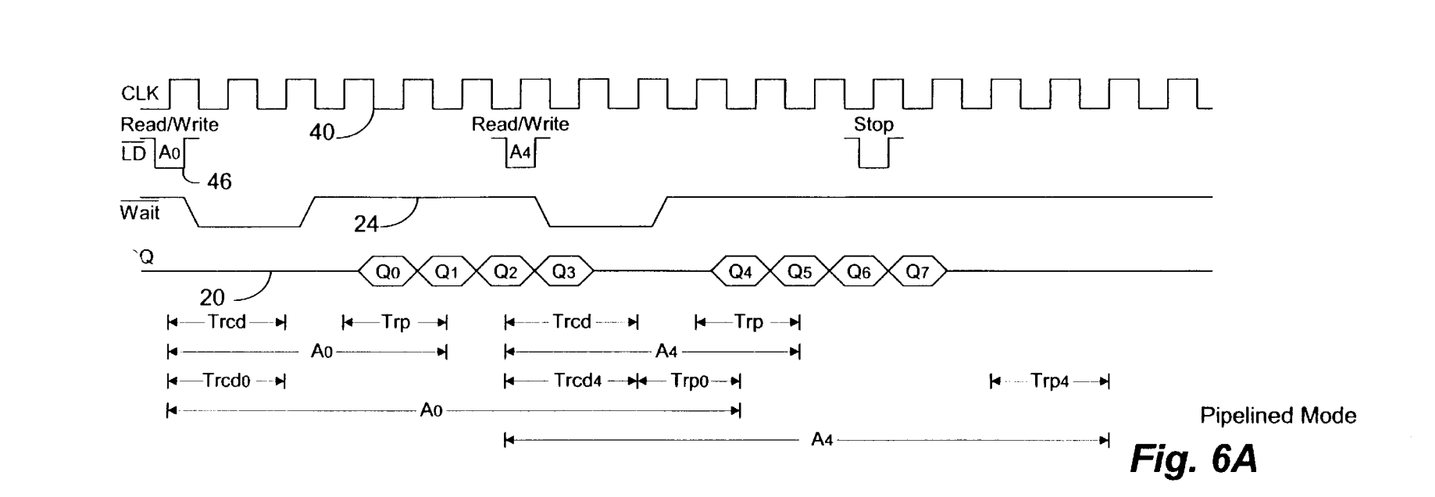
FIG. 6A is a representative timing diagram for a memory device in accordance with the present invention showing the timing for a Read "MISS" to any memory bank or Writes to alternate banks.

With reference additionally now to FIG. 6A, a representative timing diagram for a memory device 10 in accordance with the present invention is illustrated showing the timing for a Read "MISS" to any memory bank or Writes to alternate banks. This shows the reduced latency occurring when access to different banks occur.

Figure 6B:
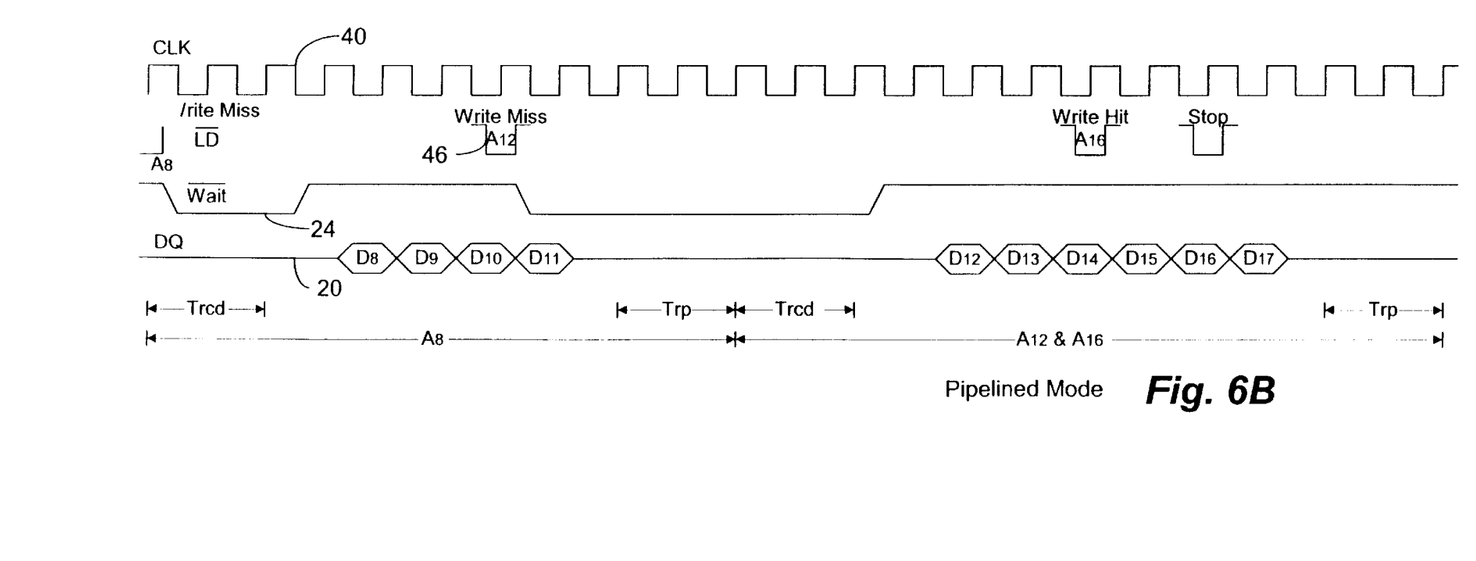
FIG. 6B is a further representative timing diagram for a memory device in accordance with the present invention showing the timing for back-to-back Writes to the same memory bank.

With reference additionally now to FIG. 6B, a further representative timing diagram for a memory device 10 in accordance with the present invention is illustrated showing the timing for back-to-back Writes to the same memory bank. This shows the latency required to close pages and open new ones in the same bank.

Figure 6C:
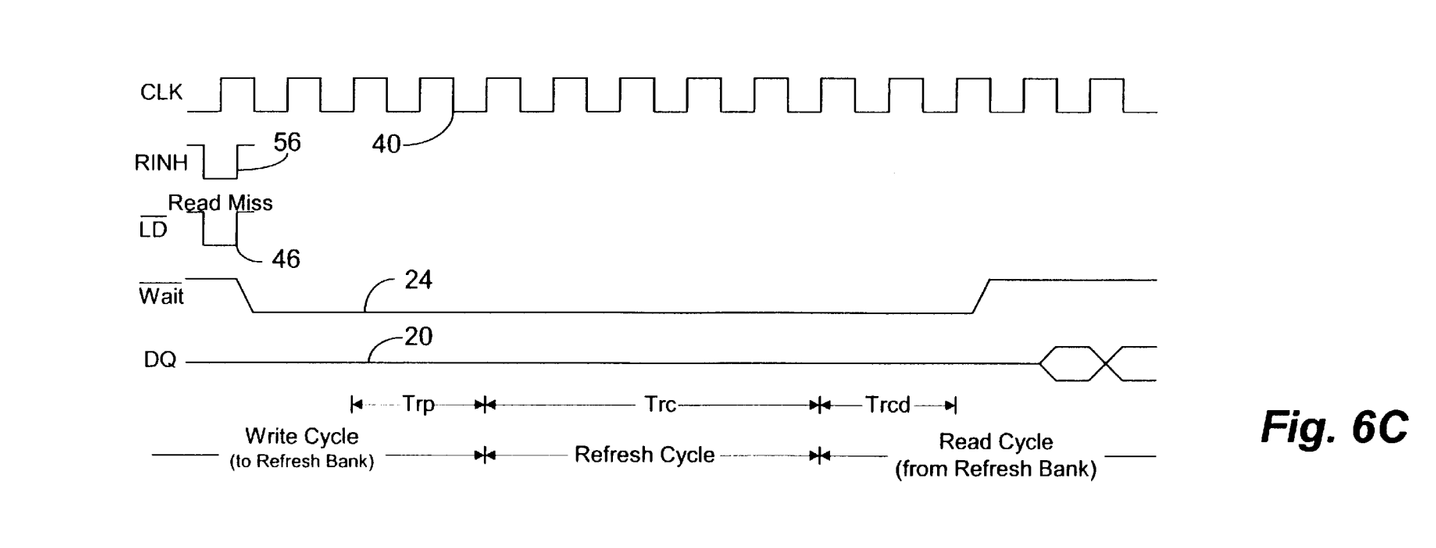
FIG. 6C is an additional representative timing diagram for a memory device in accordance with the present invention illustrating a worst case refresh delay of twelve clock cycles.

With reference additionally now to FIG. 6C, an additional representative timing diagram for a memory device 10 in accordance with the present invention is shown illustrating a worst case refresh delay of twelve clock cycles. This shows the latency impact of refresh cycles.

While there have been described above the principles of the present invention in conjunction with specific device layout, functionality and associated circuitry, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. A method for operating an integrated circuit memory device having an address bus and a data bus, said method comprising:

providing at least one dynamic random access memory array having at least one static register associated therewith;

placing address signals on said address bus corresponding to a selected memory location in said at least one dynamic random access memory array;

inputting data signals on said data bus corresponding to write data to be written to said selected memory location in said at least one dynamic random access memory array;

placing other address signals on said address bus corresponding to read data to be read from another selected memory location in said at least one dynamic random access memory array;

storing at least a portion of said read data to said at least one static register;

outputting said read data on said data bus from said at least one static register;

performing a refresh operation to said at least one dynamic random access memory array during at least a portion of said step of outputting said read data; and providing a wait signal output from said memory device indicative of said refresh operation.

2. The method of claim 1 further comprising:

generating an internal hit signal in response to said other address signals if said at least a portion of said read data is currently stored in said at least one static register; and obviating said step of storing said at least a portion of said read data to said at least one static register.

3. A method for operating an integrated circuit memory device having an address bus and a data bus, said method comprising:

providing at least one dynamic random access memory array having at least one static register associated therewith;

placing address signals on said address bus corresponding to a selected memory location in said at least one dynamic random access memory array;

inputting data signals on said data bus corresponding to write data to be written to said selected memory location in said at least one dynamic random access memory array;

placing other address signals on said address bus corresponding to read data to be read from another selected memory location in said at least one dynamic random access memory array;

storing at least a portion of said read data to said at least one static register;

automatically initiating a periodic refresh operation to said at least one dynamic random access memory array;

asserting a refresh inhibit signal to said memory device; and inhibiting said periodic refresh operation for a predetermined time period in response to said asserted refresh inhibit signal.

4. The method of claim 3 further comprising:

outputting said read data on said data bus from said at least one static register during at least a portion of said periodic refresh operation.

5. The method of claim 3 further comprising:

initiating at least one refresh operation to said at least one dynamic random access memory array following said predetermined time period.

6. A method for operating an integrated circuit memory device having an address bus and a data bus, said method comprising:

providing at least one dynamic random access memory array having at least one static register associated therewith;

placing address signals on said address bus corresponding to a selected memory location in said at least one dynamic random access memory array;

inputting data signals on said data bus corresponding to write data to be written to said selected memory location in said at least one dynamic random access memory array;

placing other address signals on said address bus corresponding to read data to be read from another selected memory location in said at least one dynamic random access memory array;

storing at least a portion of said read data to said at least one static register;

automatically initiating a periodic refresh operation to said at least one dynamic random access memory array;

asserting a refresh inhibit signal to another associated memory device; and synchronizing said periodic refresh operation of said memory device and said another memory device in response to said refresh inhibit signal.

7. The method of claim 6 further comprising:

outputting said read data on said data bus from said at least one static register during at least a portion of said periodic refresh operation.

8. A method for operating an integrated circuit memory device having an address bus and a data bus, said method comprising:

providing at least one dynamic random access memory array having at least one static register associated therewith;

placing address signals on said address bus corresponding to a selected memory location in said at least one dynamic random access memory array;

inputting data signals on said data bus corresponding to write data to be written to said selected memory location in said at least one dynamic random access memory array;

placing other address signals on said address bus corresponding to read data to be read from another selected memory location in said at least one dynamic random access memory array;

storing at least a portion of said read data to said at least one static register;

automatically initiating a periodic refresh operation to said at least one dynamic random access memory array;

asserting a refresh signal to another associated memory device indicative of a commencement of said refresh operation to said at least one dynamic random access memory array; and outputting said read data on said data bus from said at least one static register during at least a portion of said periodic refresh operation.

9. A method for operating an integrated circuit memory device having an address bus and a data bus, said method comprising:

providing at least one dynamic random access memory array having at least one static register associated therewith;

placing address signals on said address bus corresponding to a selected memory location in said at least one dynamic random access memory array;

inputting data signals on said data bus corresponding to write data to be written to said selected memory location in said at least one dynamic random access memory array;

placing other address signals on said address bus corresponding to read data to be read from another selected memory location in said at least one dynamic random access memory array;

storing at least a portion of said read data to said at least one static register;

automatically initiating a periodic refresh operation to said at least one dynamic random access memory array;

asserting a mode signal to said memory device;

alternatively commencing said refresh in response to said asserted mode signal; and outputting said read data on said data bus from said at least one static register during at least a portion of said periodic refresh operation.

10. A method for operating an integrated circuit memory device having an address bus and a data bus, said method comprising:

providing at least one dynamic random access memory array having at least one static register associated therewith;

placing address signals on said address bus corresponding to a selected memory location in said at least one dynamic random access memory array;

inputting data signals on said data bus corresponding to write data to be written to said selected memory location in said at least one dynamic random access memory array;

placing other address signals on said address bus corresponding to read data to be read from another selected memory location in said at least one dynamic random access memory array;

storing at least a portion of said read data to said at least one static register;

automatically initiating a precharge operation to at least a portion of said at least one dynamic random access memory array;

asserting a chip enable signal to said memory device; and alternatively commencing said precharge operation to any open pages in said at least a portion of said at least one dynamic random access memory array in response to said asserted chip enable signal.

11. The method of claim 10 further comprising:

outputting said read data on said data bus from said at least one static register during at least a portion of said precharge operation.

* * * * *